United States Patent
Fischer et al.

(10) Patent No.: US 7,159,786 B2
(45) Date of Patent: Jan. 9, 2007

(54) DATA CARRIER CARD

(75) Inventors: Jurgen Fischer, Deuerling (DE); Herbert Palm, Hohenkirchen (DE); Frank Puschner, Kelheim (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/925,882

(22) Filed: Aug. 23, 2004

(65) Prior Publication Data

US 2005/0045730 A1    Mar. 3, 2005

Related U.S. Application Data

(63) Continuation of application No. PCT/DE03/00215, filed on Jan. 27, 2003.

(30) Foreign Application Priority Data

Feb. 26, 2002  (DE)  ................. 102 08 168

(51) Int. Cl.
 *G06K 19/06* (2006.01)
(52) U.S. Cl. ............................. 235/492; 235/487
(58) Field of Classification Search ............... 235/375, 235/492, 439, 379, 380, 739, 487–490; 380/24; 361/760; 257/698; 437/209; 357/80, 74, 357/79

See application file for complete search history.

(56) References Cited

U.S. PATENT DOCUMENTS

| | | | | |
|---|---|---|---|---|
| 4,649,418 A | * | 3/1987 | Uden | 257/679 |
| 4,780,793 A | * | 10/1988 | Ohtsuki | 361/756 |
| 4,918,513 A | * | 4/1990 | Kurose et al. | 439/73 |
| 4,966,857 A | * | 10/1990 | Haghiri-Tehrani et al. | 156/293 |
| 5,038,250 A | | 8/1991 | Uenaka et al. | |
| 5,371,408 A | * | 12/1994 | Moulton et al. | 257/730 |
| 5,748,737 A | * | 5/1998 | Daggar | 705/41 |
| 6,040,622 A | | 3/2000 | Wallace | |
| 6,053,414 A | * | 4/2000 | Stoll et al. | 235/492 |
| 6,198,044 B1 | | 3/2001 | Venambre et al. | |
| 6,288,904 B1 | * | 9/2001 | Houdeau et al. | 361/760 |
| 6,313,524 B1 | * | 11/2001 | Pueschner et al. | 257/698 |
| 6,333,854 B1 | * | 12/2001 | Sasaoka et al. | 361/737 |
| 6,433,285 B1 | * | 8/2002 | Maeda et al. | 174/260 |
| 6,704,204 B1 | * | 3/2004 | Eskildsen et al. | 361/737 |

FOREIGN PATENT DOCUMENTS

| | | |
|---|---|---|
| DE | 196 01 203 A1 | 3/1997 |
| DE | 196 15 980 A1 | 10/1997 |
| DE | 197 02 532 A1 | 3/1998 |
| DE | 197 01 163 A1 | 7/1998 |
| DE | 198 44 965 A1 | 4/2000 |
| DE | 695 12 137 T2 | 5/2000 |
| FR | 2 789 505 A1 | 8/2000 |
| WO | WO 00/48250 | 8/2000 |

\* cited by examiner

*Primary Examiner*—Steven S. Paik
(74) *Attorney, Agent, or Firm*—Dickstein Shapiro LLP

(57) ABSTRACT

Data carrier card having a card body of a flat form and having a recess, a carrier, a chip arranged on the carrier and inserted in the recess of the card body, external contact elements arranged on the carrier and electrically connected to the chip via conductor runs, and a cover covering the recess in operative connection with the carrier such that the carrier is held along the bottom in the recess, wherein the external contact elements and the chip are arranged on a same side of the carrier.

20 Claims, 2 Drawing Sheets

DATA CARRIER CARD

CROSS-REFERENCE TO RELATED APPLICATION

This application is a continuation of International Patent Application Serial No. PCT/DE03/00215, filed Jan. 27, 2003, which published in German on Sep. 4, 2003 as WO 03/073372, and is incorporated herein by reference in its entirety.

FIELD OF THE INVENTION

The invention relates to a data carrier card with a card body of a flat form, which has a recess into which a chip is inserted, and with external contact elements, which are electrically connected to the chip via conductor runs.

BACKGROUND OF THE INVENTION

In the case of data carrier cards of the said type, one or more chips are applied by bare-chip mounting to what are known as MID conductor tracks and are subsequently encapsulated in a plastic molding compound. Subsequently, the recess is closed by a cover, the cover covering at least the recess. In many cases, even the entire flat side of the data carrier card which contains the recess is covered. The term "MID" stands for "Molded Interconnect Device", that is a three-dimensional, injection-molded leadframe. Consequently, the term "MID conductor tracks" refers to the formation of three-dimensionally running conductor tracks, which are usually applied to a three-dimensionally structured substrate.

The data carrier cards are often referred to as chip cards, since a chip is generally included as a data memory or as a data processor. In the case of such data carrier cards, either a module comprising a small printed circuit board with a chip mounted on it or a chip mounted on a leadframe and encapsulated in plastic is inserted into the recess of the card body. For data transmission to the outside or in the direction of the card, it is merely necessary to keep contacts free. Contactless transmission via transmitting and receiving units is also possible in principle.

A data carrier card in which a chip is mounted in the recess by bare-chip mounting and is contacted by MID conductor tracks is known from DE 196 01 203 A1. To protect the chip mechanically or from corrosion, a plastic covering composition is introduced into the recess, so that it covers or fills it. Subsequently, a cover is provided on the side on which the chip was inserted into the recess. The flat sides of the data carrier card may be completed by printing or labeling.

An alternative data carrier card is described in DE 106 15 980 A1. It comprises a prefabricated one-piece or one-part assembly comprising a basic card body, a cover and a flexible zone of the same material, lying in between and used for swinging the cover back and forth. The data carrier card, which has a recess, may be provided with one or more chips and subsequently be closed by the cover, which is formed in one piece with the basic card body. In this case, the cover is swung back and forth by means of a flexible region lying in between, as in the manner of a hinge, and is fastened on the flat side of the card body over the recess. This arrangement consequently avoids the provision of two separate parts, the basic card body and the cover. Conductor tracks which run from the surface of the basic card body into the recess, in order to establish an electrical connection there with the chip inserted into the recess, are configured by using the MID technique.

The two data carrier arrangements known from the prior art have the disadvantage that the conductor tracks applied to a three-dimensionally structured substrate can only be produced by a complex production process. A producer of such data carrier arrangements must not only have injection-molding processes but also have production know-how in the field of structured metals.

In addition, the electrical functional testing is more difficult in the case of the data carrier cards described. It is customary after the establishment of the electrical connection between a chip and the conductor runs to check the electrical functional capability once again. This is because high temperatures occur in the case of the bonding processes frequently used, and they may damage a semiconductor chip that otherwise is functionally capable. However, testing is only possible when the chip has already been fitted into the card body. In the event of damage to the chip, consequently a card body that in itself is defect-free, with the complexly produced MID conductor tracks, must be thrown away as scrap.

SUMMARY OF THE INVENTION

An object of the present invention is therefore to provide a data carrier card on which mounting is easy and which does not have the aforementioned disadvantages.

The data carrier card according to the invention provides that the chip or chips are not inserted directly into the recess of a flat card body, but instead is or are arranged on a carrier. The carrier likewise receives the external contact elements, which are connected to the chip via conductor runs. In this case, it is envisaged to arrange the external contact elements and the chip on the same side of a carrier.

Consequently, electrical functional testing of the arrangement is possible already before the card body is fitted into the recess. Defective chips or defective chip arrangements, understood hereafter as meaning at least one chip arranged on a carrier, can consequently be segregated as scrap before they are fitted into the card body.

Chip arrangements which carry not only the chip but also external contact elements are known in principle from the field of chip cards and are referred to there as chip modules. The chip arrangement according to the invention, however, is not such a chip module known from the prior art. In the prior art, the external contact elements and the chip are usually arranged on opposite sides of the carrier. Consequently, contact elements which pass through the carrier are necessary for the electrical contacting. However, these contact elements, which are also referred to as via holes, require a large number of process steps in the production of the chip arrangement. The invention makes much easier production possible, by the external contact elements and the chip being arranged on the same side of the carrier.

The carrier preferably extends three-dimensionally in the recess of the flat card body. The carrier could in this case be formed from the outset in the three-dimensional shape of the recess, so that it bears predominantly against the faces of the recess. The carrier is preferably flexibly formed, so that it is initially of a planar form during the production of the chip arrangement. Only once the external contact elements and the chip or chips together with the conductor runs have been laid out on the carrier and electrically tested is the carrier adapted to the shape of the recess. In this case, the carrier preferably runs along the bottom of the recess.

Therefore, the carrier expediently has a carrier layer of a flexible material, for example polyimide, PET, PEN, facilitating introduction into the recess and molding to its shape.

Since the external contact elements and the chip or chips are disposed in two planes, preferably running parallel and offset with respect to each other, it is advantageous if the bottom has a (flat) ramp, so that excessive bending of the carrier is avoided when it is introduced into the recess. If both the carrier and the conductor runs consist of a highly flexible material, it would of course also be conceivable to form the recess in a step-shaped manner.

The conductor runs are preferably arranged on the carrier. This provides the possibility of complete production and testing of the chip arrangement.

To prevent the conductor runs from tearing off or snapping off, the conductor runs preferably consist of extensible material.

In a development of the invention, a cover covering the recess is in operative connection with the carrier in such a way that the latter is held, preferably along the bottom, in the recess. The carrier consisting of a flexible material is consequently pressed by the cover into the recess and held there. Securement may take place, for example, by a snap-in connection between the cover and the card body. Adhesive bonding or welding to fix the carrier and to fix the cover is consequently not necessary, but nevertheless conceivable. By dispensing with adhesive bonding or welding, neither the card body nor the carrier with the chips fastened on it is subjected to thermal stress. The reliability of the overall arrangement is increased as a result. In addition, low-cost production is possible.

In a development, the cover is provided with at least one projection, which is releasably connected to the card body. The cover may consist of the same material as the card body or different material. It may be produced as a separate component or be connected to the card body in one piece. A label may be applied to the cover. This label may already have been applied to the cover before it is connected to the card body. The provision of a label on the surface opposite from the recess of the card body is likewise conceivable.

The data carrier card according to the invention preferably represents a multimedia card, which is provided with labels on the front side and the rear side.

BRIEF DESCRIPTION OF THE DRAWINGS

The invention is explained in more detail on the basis of the following figures, in which.

DETAILED DESCRIPTION OF THE PREFERRED MODE OF THE INVENTION

Figure 1:
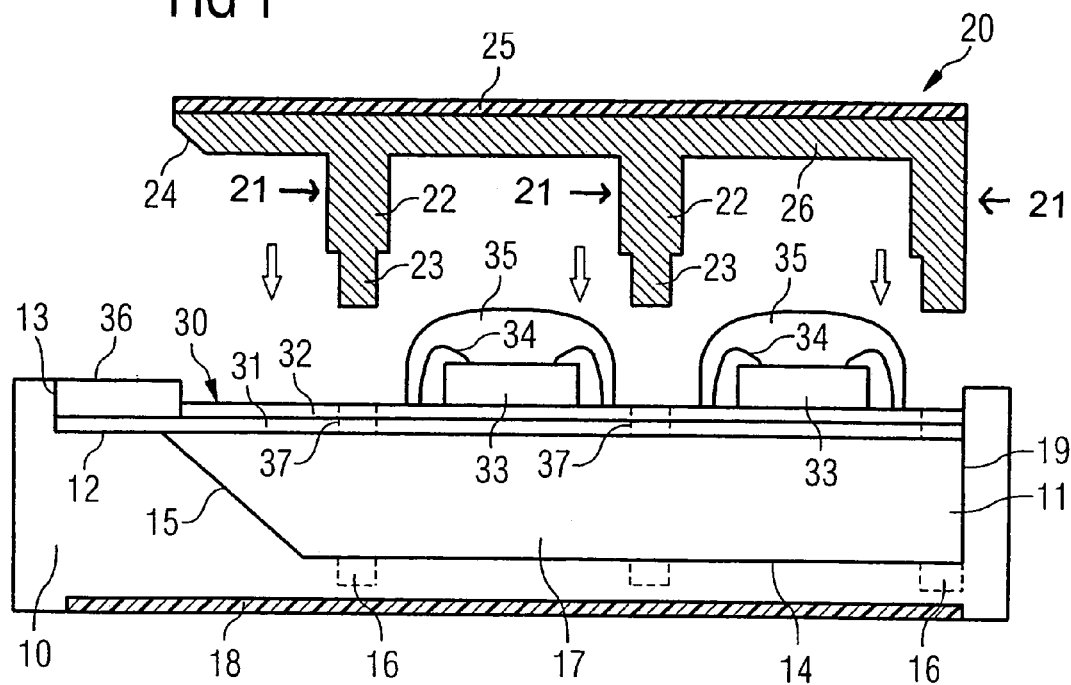
FIG. 1 shows an exemplary embodiment of the data carrier card according to the invention before the cover is connected to the card body.

FIG. 1 shows a first exemplary embodiment of a data carrier card according to the invention, with a card body 10, a carrier 30 having external contact elements 36 and two chips 33, and also a cover 20. In the representation of FIG. 1, the cover 20 has not yet been connected to the card body 10.

The card body 10 has a recess 11, which is formed by a side edge 13, a resting surface 12, a sloping-down side edge 15, a bottom 14 and a side edge 19. The bottom 14 has bores 16, which are provided for the detachable fastening of the cover 20. Provided on the surface of the card body 10 opposite from the recess is a label 18, which is embedded flush in the card body.

The carrier 30 comprises a flexible carrier layer 31 and, applied to it, preferably flexible, conductor runs 32. An arrangement of this type is known by the name flexible printed circuit board. According to the invention, the external contact elements 36, the conductor runs 32 and the chips 33 are applied to the same side of the carrier.

In contrast with known arrangements, in which the components mentioned are facing the recess, the external contact elements, conductor runs and chips are facing outward. As FIG. 1 shows well, the carrier 30 initially has a planar form. On account of the flexibility of the carrier 30, it can be pressed, together with the chips 33, into the recess in a simple way.

This takes place by means of the cover 20, which has projections 21, for example three of them. These respectively have a lower region 22 and a narrower upper region 23. The upper regions 23 of the projections 21 are led through bores 37 in the carrier 30. When the cover 20 is pressed down, the carrier 30 is pressed by the lower regions 22 of the projections 21 into the recess 11. The upper regions 23 thereby engage in the bores 16 in the card body and establish a firm but releasable connection between the cover 20 and the card body 10.

The cover 20 has on its left side an angled region 24. As can be seen better from FIG. 2, this serves the purpose of providing a pressing surface for the carrier 30.

The dimensions of the cover 20, in particular the length of the lower region of the projection 22 and the thickness of the cover part 26, are set such that the surface of the cover part 26 comes to lie flush with the card body. In the present case, the cover 20 has a label 25, which ends flush with the card body 10.

On account of the flexibility of the carrier 30, it molds itself to the bottom of the recess 11 of the card body. This can be seen from FIG. 2.

The external contact elements 36, only one of which can be seen in cross section, in this case lie on the resting surface 12 and are embedded in the card body or the recess 11 in such a way that a planar surface of the data carrier card is ensured.

Figure 2:
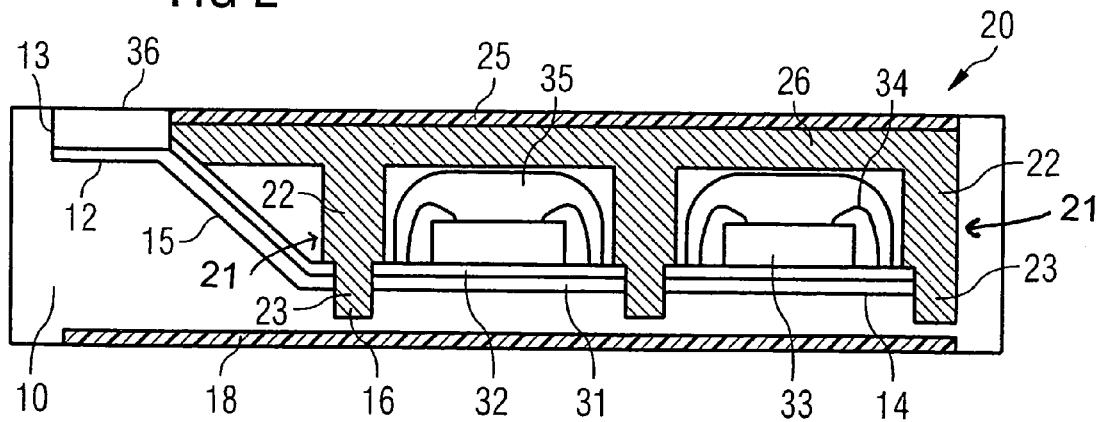
FIG. 2 shows a data carrier card in which the cover has been connected to the card body.
Figure 3:
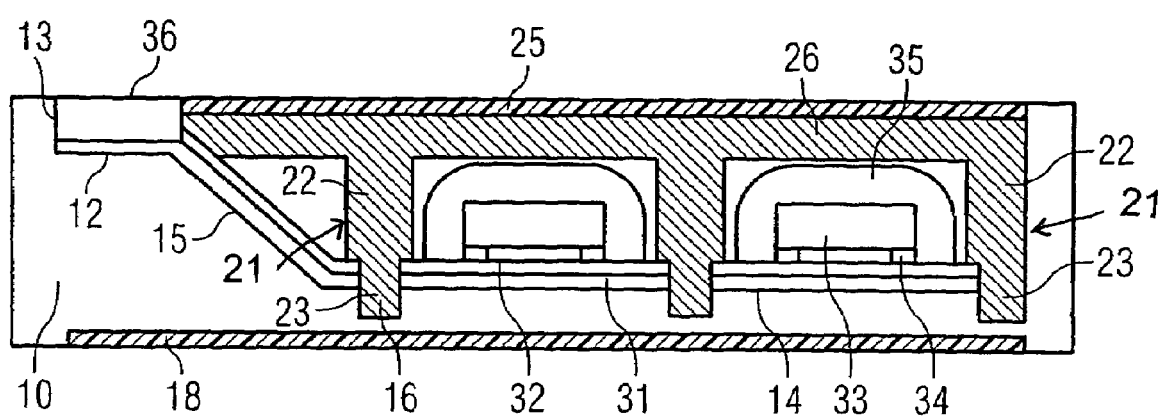
FIG. 3 shows a second exemplary embodiment of a data carrier card in which the cover has been connected to the card body.

The chips 33 are connected to the conductor runs 32 on the carrier layer 31 by means of connecting elements 34. As shown in FIGS. 1 and 2, the connecting elements 34 may in this case be configured as bonding wires. In FIG. 3, the connecting elements 34 are configured in the form of solder balls. In principle, of course, any electrical connection between a chip 33 and the conductor runs 32 is conceivable. For the mechanical protection of the chips 33, an encapsulating compound 35 is additionally provided.

The cover 20 may consist of the same material as the card body 10. In the variants shown in the exemplary embodiments, the data carrier card according to the invention represents what is known as a multimedia card, which represents a storage medium for a large number of electronic devices, such as for example cameras, computers, CD players or the like.

The invention claimed is:

1. A data carrier card comprising:

a card body of a flat form and having a recess;

a carrier having a carrier layer of flexible material, wherein the carrier deflects and assumes a non-planar shape so as to conform to the shape of the recess;

a chip arranged on the carrier and inserted in the recess of the card body;

external contact elements arranged on the carrier and being electrically connected to the chip via conductor runs; and a cover covering the recess in operative connection with the carrier such that the carrier is held along the bottom of the recess, the cover being separate member that is detachably coupled to the card body, wherein the external contact elements and the chip are arranged on a same side of the carrier such that the external contact elements and the chip face the cover.

2. The data carrier card as claimed in claimed in claim 1, wherein the carrier extends three-dimensionally in the recess.

3. The data carrier card as claimed in claim 2, wherein the carrier runs along the bottom of the recess.

4. The data carrier card as claimed in claim 1, wherein the conductor runs are arranged on the carrier.

5. The data carrier card as claimed in claim 4, wherein the conductor runs are arranged on the same side of the carrier as the external contact elements and the chip.

6. The data carrier card as claimed in claim 5, wherein the conductor runs, the external contact elements, and the chip are arranged on the carrier facing outward.

7. The data carrier card as claimed in claim 1, wherein the conductor runs are extensible.

8. The data carrier card as claimed in claim 1, wherein the cover has at least one projection, which is releasably connected to the card body.

9. The data carrier as claimed in claim 8, wherein the card body includes at least one opening formed along the bottom of the recess to receive the at least one projection.

10. The data carrier as claimed in claim 9, wherein the opening is formed in the carrier layer to accommodate and receive the at least one projection of the cover and permit the at least one projection to pass therethrough into the opening formed along the bottom of the recess.

11. The data carrier as claimed in claim 8, wherein the conductor runs has at least one through opening formed therein to accommodate and receive the at least one projection of the cover.

12. The data carrier as claimed in claim 8, wherein the cover includes a plurality of projections, with the chip being disposed between two adjacent projections.

13. The data carrier card as claimed in claim 1, wherein the data carrier card is a multimedia card.

14. The data carrier as claimed in claim 1, further comprising connecting elements connecting the conductor runs to the chip.

15. The data carrier as claimed in claim 13, wherein the connecting elements are configured as bonding wires.

16. The data carrier as claimed in claim 14, wherein the connecting elements are configured in a form of solder balls.

17. The data carrier as claimed in claim 14 further comprising an encapsulating compound covering the chip and the connecting elements.

18. The data carrier as claimed in claim 1, wherein the flexible layer deforms when the cover is applied to the card body such that the flexible layer is held by the cover along the bottom of the recess.

19. The data carrier as claimed in claim 1, wherein the external contact is recessed relative to sides of the card body.

20. The data carrier as claimed in claim 1, wherein the external contact element has a thickness different from a thickness of a conductor runs.

* * * * *

UNITED STATES PATENT AND TRADEMARK OFFICE
CERTIFICATE OF CORRECTION

| | | |
|---|---|---|
| PATENT NO. | : 7,159,786 B2 | Page 1 of 1 |
| APPLICATION NO. | : 10/925882 | |
| DATED | : January 9, 2007 | |
| INVENTOR(S) | : Jurgen Fischer et al. | |

It is certified that error appears in the above-identified patent and that said Letters Patent is hereby corrected as shown below:

In Claim 1, column 5, line 11, "being separate" should read --being a separate--

In Claim 15, column 6, line 18, "claim 13" should read --claim 14--

In Claim 20, column 6, line 34, "runs" should read --run--

Signed and Sealed this

Twenty-seventh Day of March, 2007

JON W. DUDAS
*Director of the United States Patent and Trademark Office*